(12) United States Patent
Kim et al.

(10) Patent No.: US 7,987,812 B2
(45) Date of Patent: Aug. 2, 2011

(54) MASK FRAME ASSEMBLY

(75) Inventors: Eui-Gyu Kim, Suwon-si (KR); Tae-Hyung Kim, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 1402 days.

(21) Appl. No.: 11/280,682

(22) Filed: Nov. 16, 2005

(65) Prior Publication Data

US 2006/0103289 A1 May 18, 2006

(30) Foreign Application Priority Data

Nov. 18, 2004 (KR) .................. 10-2004-0094505

(51) Int. Cl.
*B05C 17/06* (2006.01)
(52) U.S. Cl. ....................... 118/504; 118/505
(58) Field of Classification Search .............. 118/504, 118/505; 313/504
See application file for complete search history.

(56) References Cited

U.S. PATENT DOCUMENTS

| | | | | |
|---|---|---|---|---|
| 3,226,255 A | * | 12/1965 | Cieniewicz et al. | 438/758 |
| 2003/0101932 A1 | * | 6/2003 | Kang | 118/504 |
| 2004/0202821 A1 | | 10/2004 | Kim et al. | |

FOREIGN PATENT DOCUMENTS

| | | |
|---|---|---|
| JP | 2004 014513 A | 1/1992 |
| JP | 2003 217850 A | 7/2003 |
| KR | 2003-0046090 | 6/2003 |
| KR | 10 2003 0093959 A | 12/2003 |
| KR | 2003-0093959 | 12/2003 |
| KR | 10 2004 0084314 A | 10/2004 |

OTHER PUBLICATIONS

Office Action (Notification of Reasons for Rejection) mailed Apr. 21, 2009 by the Japanese Patent Office for JP App. No. 2005-323862.
Notice to Submit Response by Korean Intellectual Property Office on Jun. 16, 2006.

* cited by examiner

*Primary Examiner* — Laura Edwards
(74) *Attorney, Agent, or Firm* — Knobbe Martens Olson & Bear LLP

(57) ABSTRACT

A mask assembly configured to prevent the mask from being thermally transformed and to maintain gaps between a plurality of divided pattern masks is disclosed. According to one embodiment, the mask assembly comprises: an open mask that has a plurality of first openings arranged in rows and columns; and a pattern mask that comprises a plurality of unit pattern masks. In some embodiments, the ends of the unit pattern masks may be fixed with respect to the open mask, and the unit pattern mask includes a plurality of mask pattern units configured to align with the plurality of first openings of the open mask. In some embodiments, a tensile force is applied to the unit pattern mask(s).

2 Claims, 5 Drawing Sheets

MASK FRAME ASSEMBLY

CROSS-REFERENCE TO RELATED APPLICATIONS

This application claims priority to Korean Patent Application No. 10-2004-0094505, filed on Nov. 18, 2004, in the Korean Intellectual Property Office, the disclosure of which is incorporated herein in its entirety by reference.

BACKGROUND OF THE INVENTION

1. Technical Field

The invention relates to depositing a thin film in an organic electroluminescent (EL) device.

2. Discussion of Related Technologies

Organic electroluminescent (EL) devices that are self-emitting provide advantages in a plasma display panel ("PDP") such as a wide viewing angle, high contrast, and fast response speed. As a result, they are considered to be the next generation flat panel display devices. Typically, organic EL devices include an anode, a cathode, and an organic layer having a light emission layer between the two electrodes. The organic layer is formed by way of deposition, as it is sensitive to humidity and cannot be formed in a general photolithography method.

FIG. 1 is an exploded perspective view of a conventional deposition mask frame assembly for depositing a thin film included in an organic EL device.

Referring to FIG. 1, the conventional mask 10 is formed of a metal thin plate 11 and includes a plurality of mask pattern units 12. The mask pattern units 12 enable fabrication of a plurality of unit devices including the organic EL devices onto a mother board (not shown). Each mask pattern unit 12 corresponds to a unit device. Each mask pattern unit 12 includes a plurality of openings 12a that correspond to the shape and pattern of the unit devices that will be deposited onto the mother board.

The mask 10 is fixed onto a frame 20 by applying tensile forces in an x direction and a y direction as denoted by the arrows in FIG. 1. The frame 20 includes left and right supporting bars 21, upper and lower supporting bars 22, and an opening 23.

When the mask 10 is fixed onto the frame 20, tensile force should be applied evenly to the mask 20, and a width of the openings 12a should be maintained within a predetermined tolerance.

The weight of a conventionally designed mask may cause it to droop even when the mask is fixed on the frame. A tensile force is applied to the mask in order to prevent the mask from drooping, which causes the left and right supporting bars 21 of the frame 20 to curve inward and the upper and lower supporting bars 22 to curve outward, as shown in FIG. 2. It is also possible that the left and right supporting bars 21 may curve outward and the upper and lower supporting bars 22 may curve inward.

As described above, the shape of the openings 12a may be distorted even when the pattern mask 10 is fixed on the frame 20 and an even tensile force is applied. This may generate errors between an electrode pattern (not shown) of a unit device formed on the substrate and the openings 12a of the mask pattern unit portion 12.

In order to solve the above problems, Korean published Patents No. 2003-0046090 and No. 2003-0093959 disclose a mask frame assembly for depositing a thin film of an organic EL device in which a pattern mask is divided into a plurality of unit pattern masks, and both ends of the divided unit pattern mask are fixed to the frame, and tensile force is applied to the frame.

According to the conventional mask frame assembly, the divided unit pattern mask is welded onto the frame to prevent the opening of the mask pattern unit from being transformed due to the tensile force. However, there are still problems with robustness, and maintaining desired gaps between the adjacent unit pattern masks that are fixed onto the frame.

SUMMARY OF CERTAIN INVENTIVE ASPECTS

Some aspects of the invention include a mask assembly for depositing a thin film of a flat panel display. The mask assembly may comprise: an open mask including a plurality of first openings arranged in rows and columns, the rows being formed in a first direction and the columns being formed in a second direction; and a pattern mask including a plurality of unit pattern masks. In some embodiments, a tensile force is applied to each unit pattern mask by fixing both ends of each unit pattern mask to the open mask in the first direction or the second direction. In some embodiments, each unit pattern mask includes a plurality of mask pattern units that substantially align with a single row or column of the first openings. The mask pattern units may also include a plurality of second openings that have longer sides in either the first or second direction, and the second openings may extend partially across the width of the unit pattern mask. Preferably, the plurality of second openings have the same patterns as the thin film of the flat panel display.

In some embodiments, the unit pattern mask is elongated, and attached to the open mask such that the elongated sides are oriented in the first or second direction. Generally, each unit pattern mask may include a plurality of mask pattern units that correspond to a single row or column of the first openings. Each mask pattern unit can include a plurality of slots that are elongated, partially extend across the width of the unit pattern mask, and arranged along a portion of the length of the unit pattern mask.

In another aspect of the invention, a mask frame assembly is provided for depositing a thin film of a flat panel display. The mask frame assembly may comprise a frame with a first opening. The mask frame assembly may further comprise a first mask including a plurality of second openings arranged in rows and columns, the rows being formed in a first direction and the columns being formed in a second direction. The second openings may be arranged such that they fit within the area defined by the perimeter of the first opening. The mask frame assembly may further comprise a second mask that includes a plurality of unit pattern masks, wherein each unit pattern mask includes a plurality of mask pattern units that correspond to the plurality of second openings of the first mask. A tensile force may be applied to each unit pattern mask by fixing the ends of each unit pattern mask to the first mask in the first direction.

In some embodiments, each unit pattern mask includes a plurality of mask pattern units that correspond to a row of the second openings of the first mask. In some embodiments, each mask pattern unit includes a plurality of third openings that are elongated, partially extend across the width of the unit pattern mask, and arranged along a portion of the length of the unit pattern mask. Each mask pattern unit may also include a plurality of third openings having the same pattern as the portion of a thin film corresponding to a flat panel display.

In some embodiments, the unit pattern mask may be elongated and attached to the first mask in the first direction of the first mask. The unit pattern mask may also include a plurality of mask pattern units corresponding to a row of second openings. Each mask pattern unit may also include a plurality of elongated slots, and the length of the slots may partially extend across the width of a unit pattern mask.

BRIEF DESCRIPTION OF THE DRAWINGS

The above and/or other aspects of the invention will become more apparent by describing in detail exemplary embodiments of the invention with reference to the attached drawings in which.

DETAILED DESCRIPTION OF CERTAIN INVENTIVE EMBODIMENTS

Figure 1:
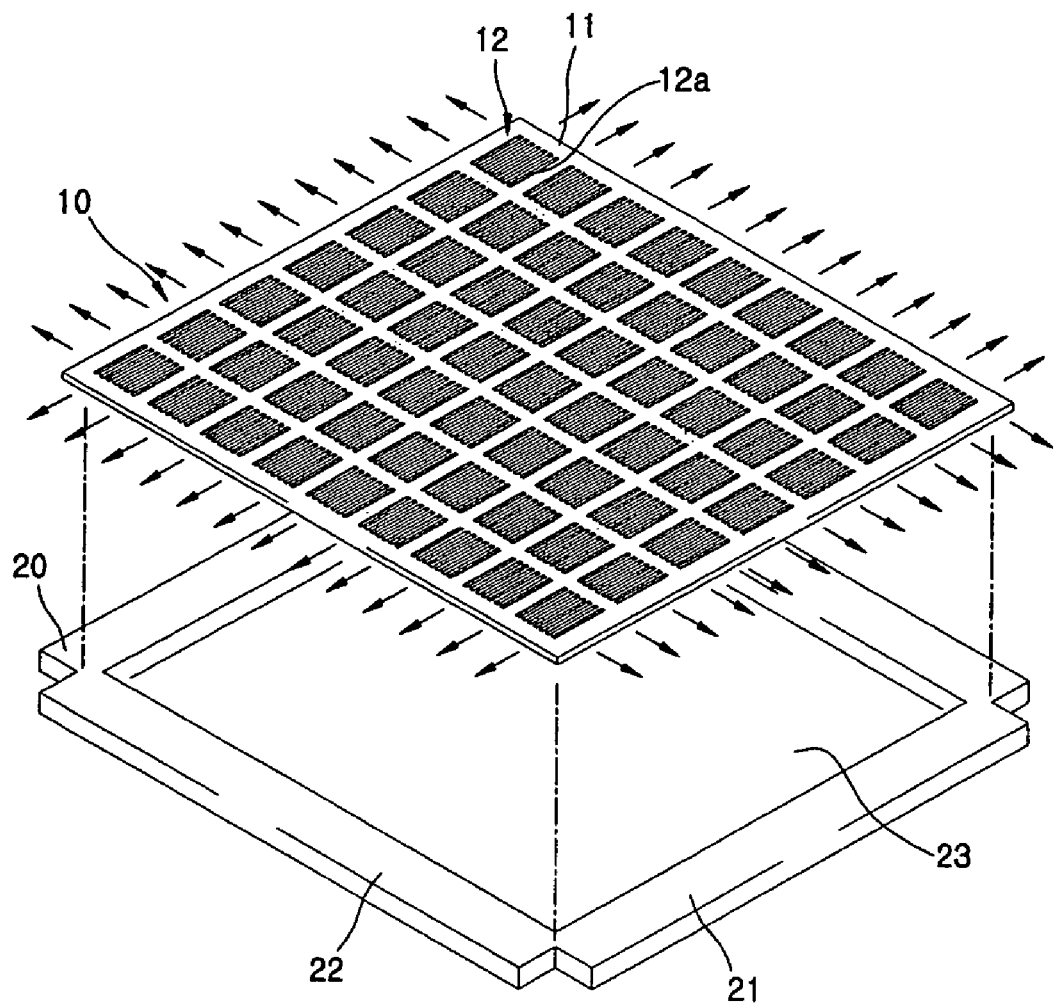
FIG. 1 is an exploded perspective view of a conventional mask frame assembly for depositing a thin film of an organic electroluminescent (EL) device.
Figure 1:
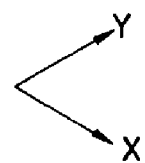
Figure 2:
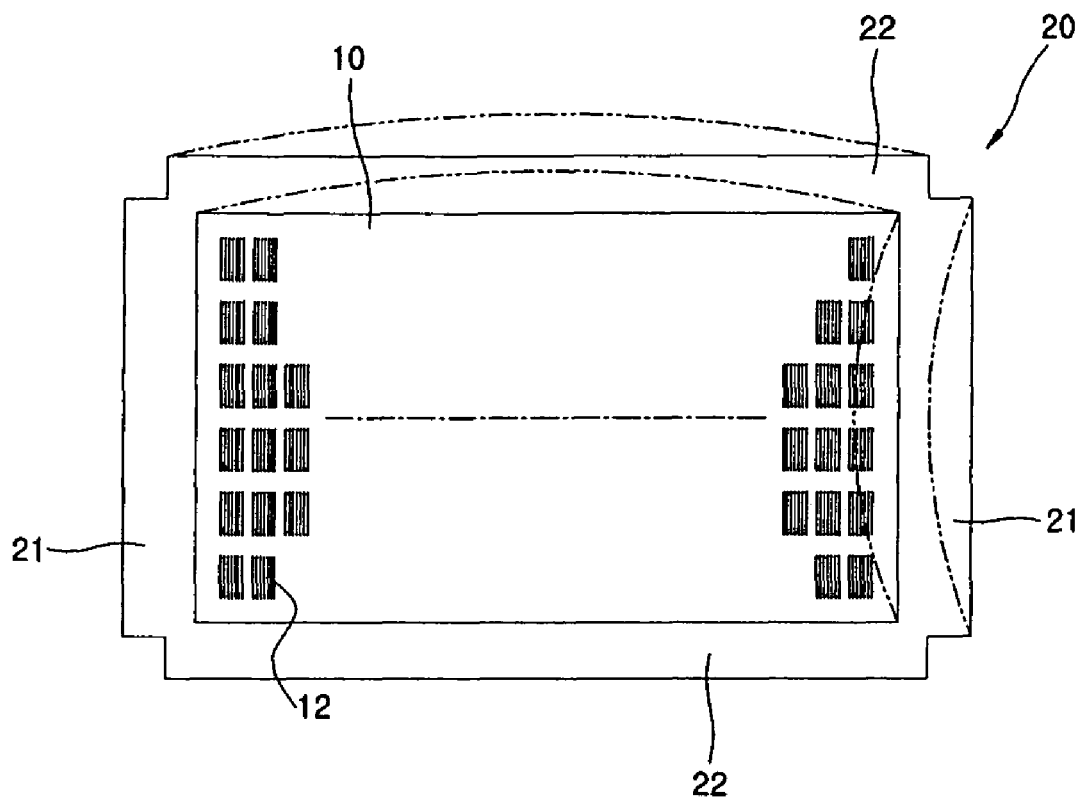
FIG. 2 is a plan view of the conventional mask frame assembly for depositing the thin film of the organic EL device.
Figure 3:
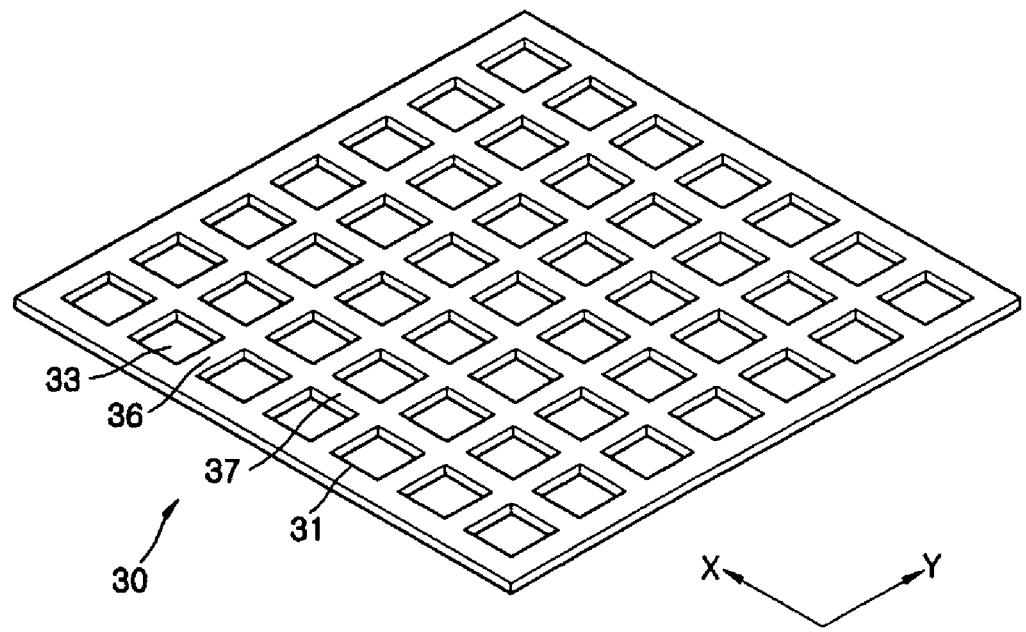
FIG. 3 is a perspective view of an open mask according to one embodiment of present invention.

FIG. 3 is one embodiment of an open mask that is part of a mask assembly used in some embodiments of the invention to deposit a thin film of an organic electroluminescent (EL) device.

Referring to FIG. 3, one embodiment of the open mask 30 includes a plurality of openings 33 corresponding to a plurality of unit devices that will be formed onto a mother board (not shown). Here, the mother board means a substrate on which the organic EL devices may be formed using the mask assembly. In some embodiments, after formation using the mask, each unit device is cut from the motherboard by scribing so as to form one organic EL device.

In some embodiments of the invention, the open mask 30 includes a plurality of ribs 36 that are parallel with respect to each other and arranged such that there are equally spaced gaps between each rib 36. The ribs 36 extend in a column direction (y-direction according to the coordinate system of FIG. 4), and plurality of ribs 37 that are parallel with respect to each other and arranged such that they are equally spaced gaps between each rib 37. The ribs 37 may extend in a row direction (x-direction according to the coordinate system of FIG. 4). Generally, ribs 36 and ribs 37 intersect each other to form a plurality of openings 33, as shown in FIG. 3. Reference numeral 31 [in FIG. 3] denotes one embodiment of a rib at an external portion. Generally, the openings 33 of the open mask 30 are arranged to correspond to the pattern of unit devices to be formed on the mother board.

Figure 4:
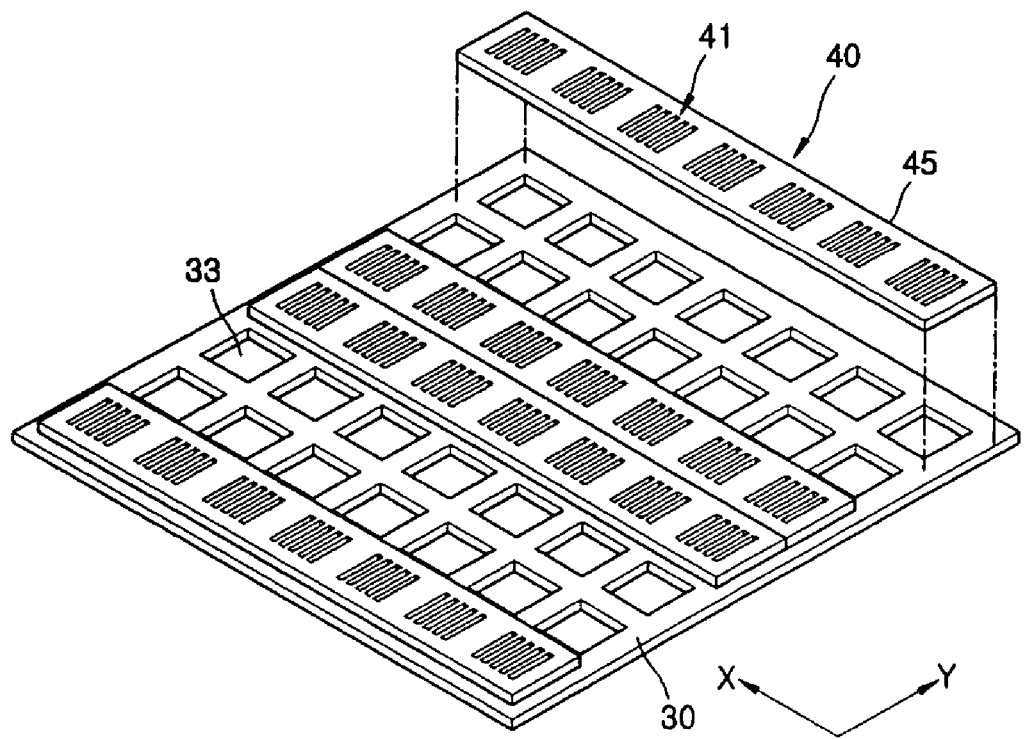
FIG. 4 is an exploded perspective view of an open mask and unit pattern masks according to one embodiment of the invention.
Figure 5:
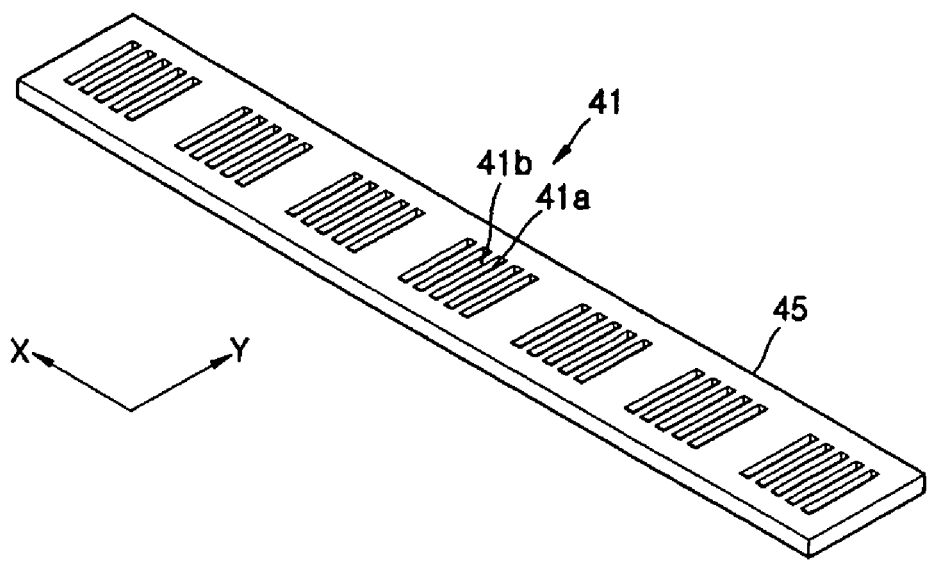
FIG. 5 is a perspective view of a unit pattern mask according to one embodiment of the invention.

Referring to FIG. 4, some embodiments of the invention include an open mask 30 and a pattern mask 40. In some embodiments, the pattern mask 40 includes a plurality of unit pattern masks 45. Generally, each unit pattern mask 45 is formed as a thin plate of rectangular shape. However, it is contemplated that the unit pattern mask 45 can be formed in other shapes. Generally, the unit pattern mask 45 includes a plurality of mask pattern units 41 arranged in the row direction (x-direction) along the length of a unit pattern mask 45.

In some embodiments, the mask pattern unit 41 is configured to correspond to the desired pattern of each organic EL device that will be formed on the mother board. Generally, the mask pattern unit 41 includes a plurality of openings 41a that are rectangular in shape and extend across a portion of the width of the unit pattern masks 45 in the column direction (y direction). However, the mask pattern unit 41 and the openings 41a can be of different shape and orientation. The openings 41a of the mask pattern unit 41 may be separated by shielding units 41b. Generally, the shielding units 41b are elongated, parallel with respect to each other, and extend in the column direction (y-direction) along the width the unit pattern mask 45.

In one embodiment of the invention, the plurality of mask pattern units 41 are arranged along the length (row, x direction) of each unit pattern mask 45. Generally, the mask pattern units 41 are arranged on the unit pattern masks 45 such that they substantially align with the openings 33 of the open mask 30. Generally, the end portions of each unit pattern mask 45 are supported by the open mask 30. See FIG. 4. Generally, the end portions are the shorter sides of the rectangular or otherwise elongated unit pattern masks 45. In some embodiments, supporting the ends of the unit pattern masks 45 on the open mask 30 allows tensile force to be applied to the unit pattern masks 45.

Generally, the unit pattern mask 45 is welded onto the open mask 30 such that the mask pattern units 41 are substantially aligned with the openings 33. Advantageously, this facilitates the placement of the pattern mask 40 with respect to the open mask 30. Furthermore, this provides improved stability of the mask pattern 40, and the mask pattern can be arranged with improved precision. In some embodiments, this allows the distance between the unit pattern masks 45 to be maintained within a predetermined range.

Here, the unit pattern mask 45 is supported by the open mask 30 in a direction of crossing the shielding units 41b of the mask pattern unit 41, and the distance between the unit pattern masks 45 is maintained by the rib 36.

When the unit pattern mask 45 is attached onto the open mask by welding, the mask pattern unit 41 of the unit pattern mask 45 corresponds to the opening 33 of the open mask 30, and thus, it is easy to arrange the pattern mask 40 with respect to the open mask 30, and stability of the arrangement is improved. Therefore, the gap between the unit mask pattern units 45 can be maintained.

In one embodiment of the present invention, the unit pattern mask 45 of the pattern mask 40 is formed as a thin plate of a stripe shape. It, however, can be formed in various other shapes.

In addition, the mask pattern unit 41 of the unit pattern mask 45 is formed as a slit in the width direction of the unit pattern mask 45 (y direction). It, however, can be formed with various other opening patterns.

Figure 6:
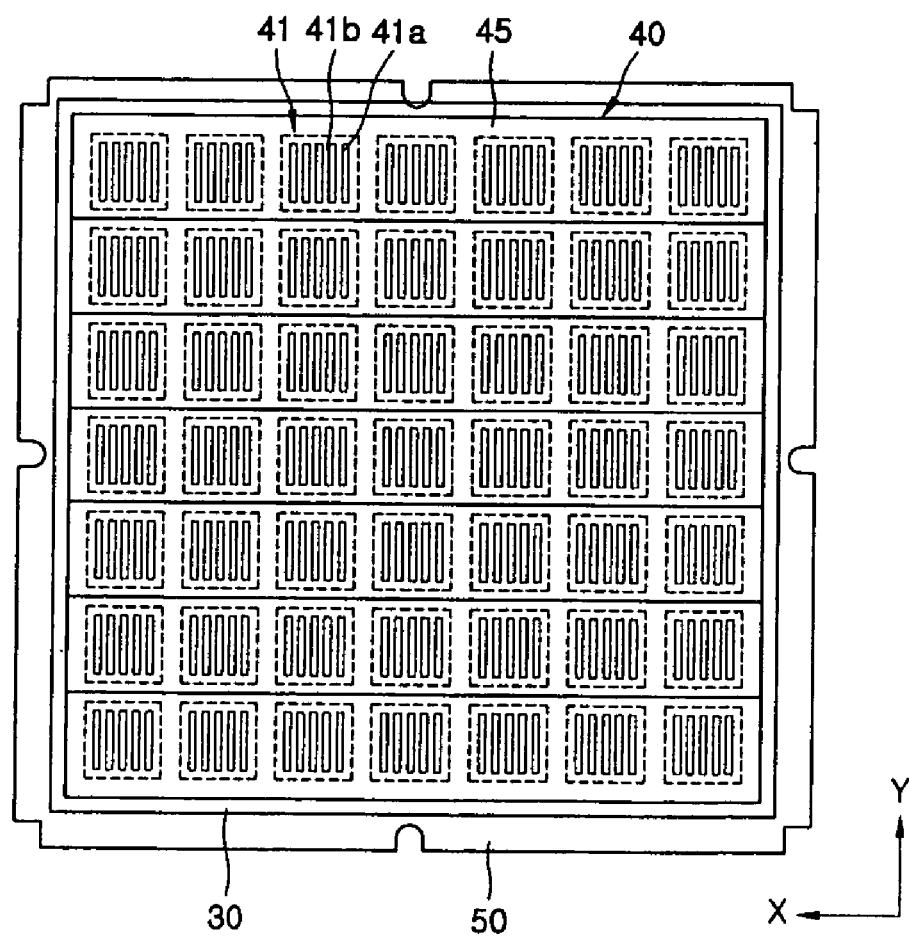
FIG. 6 is a plan view of a mask frame assembly according to one embodiment of the invention.
Figure 7:
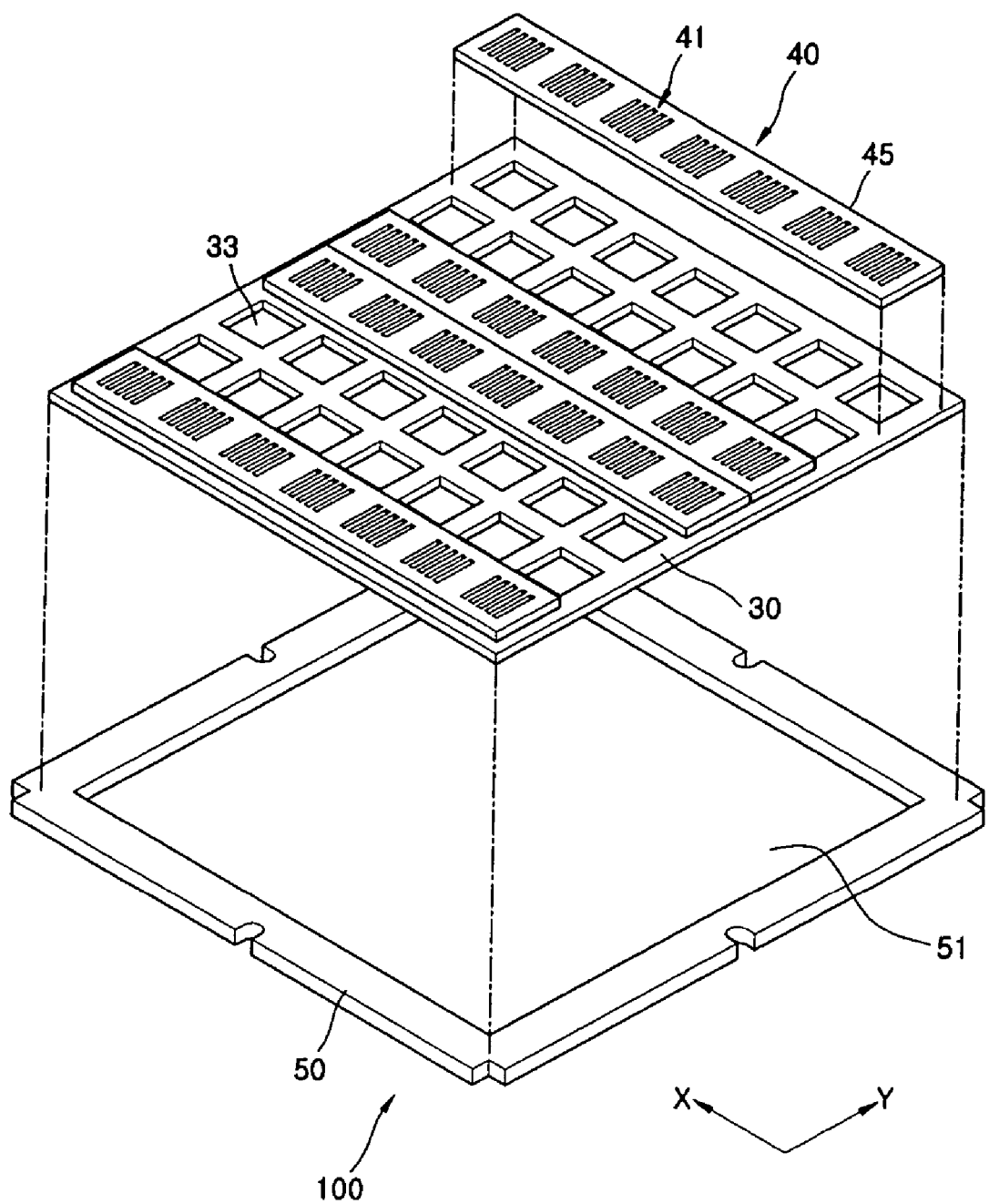
FIG. 7 is a perspective and partially exploded view of the mask frame assembly according to one embodiment of the invention.

Referring to FIGS. 6 and 7, in some embodiments, the mask frame assembly 100, includes the pattern mask 40 and the open mask 30 supported by a frame 50, which allows tensile force to be applied to the frame 50. Generally, the frame 50 includes upper and lower supporting portions, left and right supporting portions, and a single opening 51. In some embodiments, a frame 50 such as the one depicted in FIG. 7 is used as the frame structure for the mask frame assembly 100. However, frames of various structures can be used as long as they are capable of supporting the mask assembly.

In some embodiments of the mask frame assembly 100, a plurality of unit pattern masks 45 are supported by the open mask 30 in the row direction, as shown in FIG. 4. The unit pattern masks 45 may also be supported by the open mask 30 in the column direction or in both the column and row direction, depending on the support condition. Generally, the openings 33 of the open mask 30 are arranged such that the perimeter defined by the outside edges of the openings 33 closest to the edge of the open frame 30 corresponds to the opening 51 of the frame 50.

In some embodiments, the invention is used to deposit thin film in an organic EL device. However, the invention can be used to deposit electrode patterns of various flat panel displays such as liquid crystal display (LCD) apparatuses. It is also contemplated that the invention could be used to deposit thin films in other applications.

As described above, some embodiments of the invention include unit pattern masks that are supported by the open mask in the row direction (x direction), mask pattern units that are arranged on the unit pattern masks in the row direction (x direction), and openings within the mask pattern units that are formed as rectangular slits in the column direction (y direction). However, openings within the mask pattern units can be formed as the slits in the row direction (x direction). The unit pattern masks can be arranged on the open mask in the column direction (y direction), the mask pattern units of the unit pattern masks can be arranged in the row direction (x direction), and the openings of the mask pattern units can be formed as the slits in the row direction (x direction) or in the column direction (y direction).

One advantage of the invention is that the gaps between the unit pattern masks 45 can be maintained within a predetermined range, and the stability of the masks are improved.

While the invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask assembly for depositing a thin film of a flat panel display, the mask assembly comprising:
   an open mask including a plurality of first openings arranged in rows and columns, the rows being formed in a first direction and the columns being formed in a second direction; and
   a pattern mask including a plurality of unit pattern masks;
   wherein a tensile force is applied to each unit pattern mask by fixing both ends of each unit pattern mask to the open mask in the first direction or the second direction;
   wherein the unit pattern mask is elongated, and attached to the open mask such that the elongated sides are oriented in the first direction;
   wherein each unit pattern mask includes a plurality of mask pattern units that correspond to a single row or column of the first openings; and
   wherein each mask pattern unit includes a plurality of slots that are elongated and partially extend across the width of the unit pattern mask and arranged along a portion of the length of the unit pattern mask.

2. A mask frame assembly for depositing a thin film of a flat panel display, the mask frame assembly comprising:
   a frame including a first opening;
   a first mask including a plurality of second openings arranged in rows and columns, the rows being formed in a first direction and the columns being formed in a second direction, the second openings arranged such that they fit within the area defined by the perimeter of the first opening; and
   a second mask including a plurality of unit pattern masks, wherein each unit pattern mask includes a plurality of mask pattern units that correspond to the plurality of second openings of the first mask;
   wherein a tensile force is applied to each unit pattern mask by fixing the ends of each unit pattern mask to the first mask in the first direction;
   wherein the unit pattern mask is elongated and attached to the first mask in the first direction of the first mask;
   wherein the unit pattern mask includes a plurality of mask pattern units corresponding to a row of second openings; and
   wherein each mask pattern unit includes a plurality of elongated slots, the length of the slots partially extending across the width of a unit pattern mask.

* * * * *